(12) United States Patent
Hong et al.

(10) Patent No.: US 7,378,314 B2
(45) Date of Patent: May 27, 2008

(54) SOURCE SIDE INJECTION STORAGE DEVICE WITH CONTROL GATES ADJACENT TO SHARED SOURCE/DRAIN AND METHOD THEREFOR

(75) Inventors: Cheong M. Hong, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 406 days.

(21) Appl. No.: 11/170,446

(22) Filed: Jun. 29, 2005

(65) Prior Publication Data

US 2007/0001218 A1 Jan. 4, 2007

(51) Int. Cl.
*H01L 21/336* (2006.01)

(52) U.S. Cl. ............. 438/257; 438/201; 438/211; 438/267; 257/E21.179; 257/E21.679

(58) Field of Classification Search ........ 438/201, 438/211, 257, 263, 264, 267, 593–594, 596; 257/E21.179, E21.422, E21.679
See application file for complete search history.

(56) References Cited

U.S. PATENT DOCUMENTS 6,133,098 A    10/2000  Ogura et al.
6,383,872 B1 *  5/2002  Kadosh et al. .............. 438/279

\* cited by examiner

*Primary Examiner*—Thanhha S. Pham
(74) *Attorney, Agent, or Firm*—James L. Clingan, Jr.; Robert L. King

(57) ABSTRACT

A storage device has a two bit cell in which the select electrode is nearest the channel between two storage layers. Individual control electrodes are over individual storage layers. Adjacent cells are separated by a doped region that is shared between the adjacent cells. The doped region is formed by an implant in which the select gates of adjacent cells are used as a mask. This structure provides for reduced area while retaining the ability to perform programming by source side injection.

14 Claims, 3 Drawing Sheets

SOURCE SIDE INJECTION STORAGE DEVICE WITH CONTROL GATES ADJACENT TO SHARED SOURCE/DRAIN AND METHOD THEREFOR

RELATED APPLICATIONS

This application is related to the following patent applications:

U.S. patent application titled, "Source Side Injection Storage Device and Method Therefor," by Chindalore, having Ser. No. 11/170,444, filed concurrently herewith, and assigned to the assignee hereof; and U.S. patent application titled, "Source Side Injection Storage Device with Spacer Gates and Method Therefor," by Hong et al., having Ser. No. 11/170,447, filed concurrently herewith, and assigned to the assignee hereof.

FIELD OF THE INVENTION

This invention relates to non-volatile memories, and more particularly to storage devices in the non-volatile memories that use source side injection.

BACKGROUND OF THE INVENTION

Source side injection (SSI) has been found to have benefits over regular hot carrier injection (HCI) used in the programming of non-volatile memories (NVMs). Programming by SSI is able to be performed at significantly lower power than programming by regular (HCI). This is particularly important in uses such as cell phones in which battery operation is very important. One of the disadvantages of SSI is that the storage devices require more area on the integrated circuit which increases cost. The design of the individual memory cells for SSI generally includes a transition in the gate structure over the channel which requires more area.

One of the techniques in the attempt to reduce the impact of the increased storage-device size has been the use of a virtual ground array (VGA) architecture. VGA has been known to require relatively small area compared to other architectures while increasing other difficulties such as read disturb. This has nonetheless been a popular architecture for low cost NVMs. Further reductions in space in the storage cell would further reduce size and thus cost.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a storage device has a two bit cell in which the select electrode is nearest the channel between two storage layers. Individual control electrodes are over individual storage layers. Adjacent cells are separated by a doped region that is shared between the adjacent cells. The doped region is formed by an implant in which the control gates of adjacent cells are used as a mask. This structure provides for reduced area while retaining the ability to perform programming by SSI. This is better understood by reference to the drawings and the following description.

Figure 1:
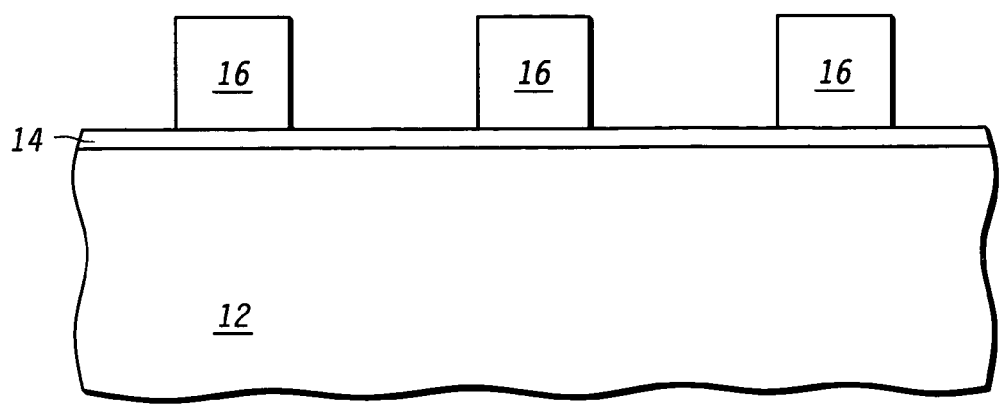
FIG. 1 is a cross section of a storage device structure at a stage in processing according to one embodiment.

Shown in FIG. 1 is a storage device structure 10 comprising a semiconductor substrate 12, a silicon oxide layer 14 on semiconductor substrate 12, and a plurality of patterned silicon nitride layers 16 on silicon oxide layer 14 which leaves portions of silicon oxide layer 14 exposed. Silicon oxide layer 14 is preferably 50-100 Angstroms thick. Patterned silicon nitride layers 16 are preferably about 1000 Angstroms thick, about 1500 Angstroms wide, and about 1500 Angstroms apart. These layers may run for a comparatively long length, for example the length of a memory array. Semiconductor substrate 12 is preferably silicon but could be another semiconductor material.

Figure 2:
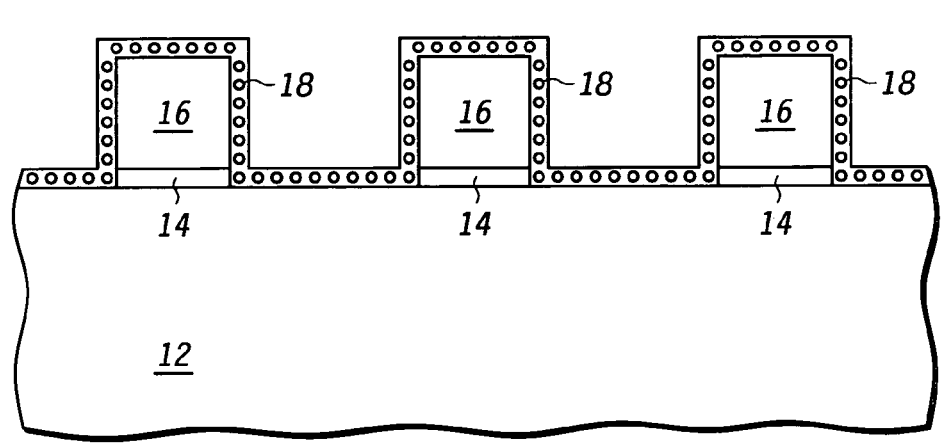
FIG. 2 is a cross section of the storage device structure of FIG. 1 at a subsequent stage in processing.

Shown in FIG. 2 is storage device structure 10 after formation of a storage layer 18 that is over patterned silicon nitride layers 16 and that replaces the previously exposed portion of silicon oxide layer 14. Silicon oxide layer 14 that was under patterned silicon nitride layers 16 remains. Storage layer 18 is preferably nanocrystals embedded in a dielectric. Storage layer 18 could also be another storage material such as polysilicon surrounded by a dielectric or nitride. Nanocrystals are also called nanoclusters and are typically of silicon.

Figure 3:
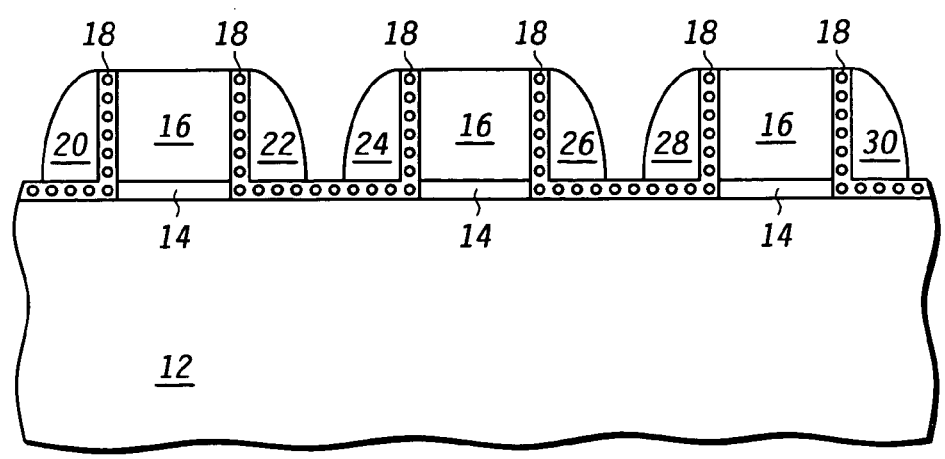
FIG. 3 is a cross section of the storage device structure of FIG. 2 at a subsequent stage in processing.

Shown in FIG. 3 is storage device structure 10 after formation of sidewall spacers 20, 22, 24, 26, 28, and 30 (20-30) on sides of patterned silicon nitride layers 16. This is performed by depositing a layer of polysilicon, which is conformal, and then performing an anisotropic etch on the conformal layer. The conformal layer should be either conductive or able to become conductive. In the case of polysilicon, it is doped in order to be conductive. The doping typically occurs by implants after deposition but could be by in situ doping or a combination of in situ doping and subsequent implants. The etch back has the effect of also removing the portion of storage layer 18 that is over patterned silicon nitride layers 16. Sidewall spacers 20-30 of polysilicon are to be used as control gates.

Figure 4:
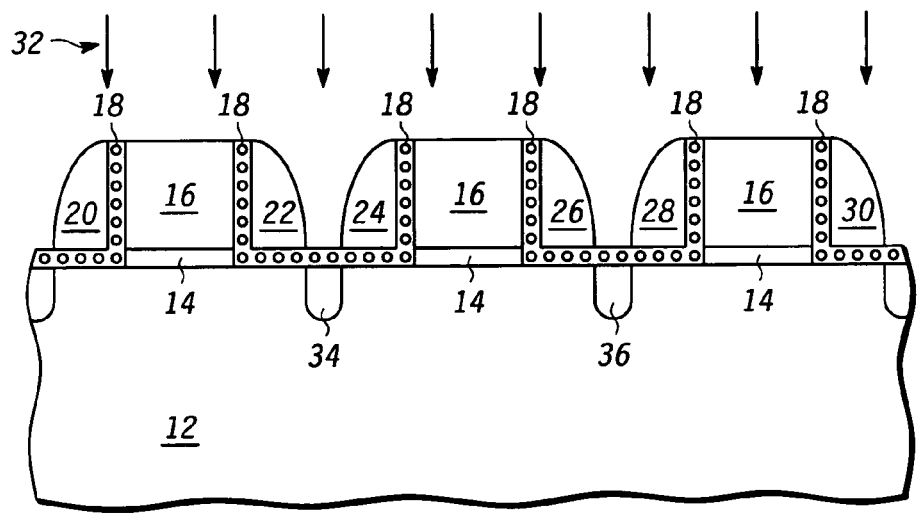
FIG. 4 is a cross section of a storage device structure of FIG. 3 at a subsequent stage.

Shown in FIG. 4 is a storage device structure 10 after an implant 32 to form doped regions 34 and 36 between patterned silicon nitride layers 16 as masked by sidewall spacers 22 and 24 and sidewall spacers 26 and 28, respectively. Doped regions 34 and 36 are preferably doped to N type to a depth for use as a source/drain. The N-type doping can be achieved using phosphorus or arsenic. For P channel operation, doped regions 34 and 36 can be doped to P type instead of N type.

Figure 5:
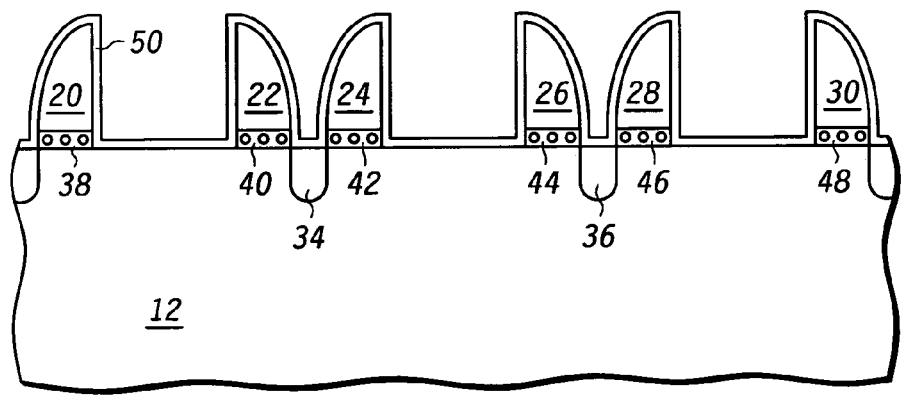
FIG. 5 is a cross section of the storage device structure of FIG. 4 at a subsequent stage in processing.

Shown in FIG. 5 is storage device structure 10 after removal of patterned silicon nitride layers 16 and the remaining portions of silicon oxide layer 14. This is achieved using a dry chlorine etch which is commonly used for etching nitride. This also removes oxide but is selective to silicon. This leaves sidewall spacers 20-30, which are preferably polysilicon and portions of semiconductor substrate 12, which is also silicon, exposed. A dielectric layer 50 is then conveniently grown as an oxide layer on the exposed silicon of semiconductor substrate 12 and sidewall spacers 20-30. This oxide layer is preferably about 50-300 Angstroms thick. It will function as a gate dielectric in the areas where it is grown on semiconductor substrate 12 and as an insulating layer between sidewall spacers 20-30 acting as control electrodes and the subsequently formed select gates. Although oxide is preferable for this application in part because it can be conveniently grown, another dielectric material may be deposited, such as a high K dielectric such as hafnium oxide.

Figure 6:
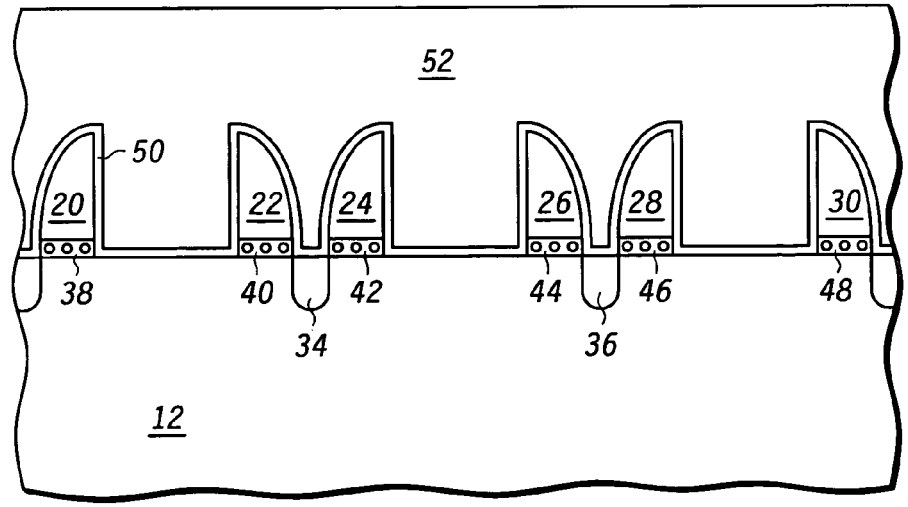
FIG. 6 is a cross section of the storage device structure of FIG. 5 at a subsequent stage in processing.

Shown in FIG. 6 is storage device structure 10 after formation of a select gate 52. This is shown as a planar layer but it may also be formed as a conformal layer. Select gate 52 may also be a stack of different conductive layers. Select gate 52 is preferably a metal that is deposited by plating but could be another material and could be deposited by another method for depositing a layer that can be useful as a gate. In the case of plating, a seed layer (not separately shown) would be formed before the plating of select gate 52. In this example the metal is preferably tungsten.

Figure 7:
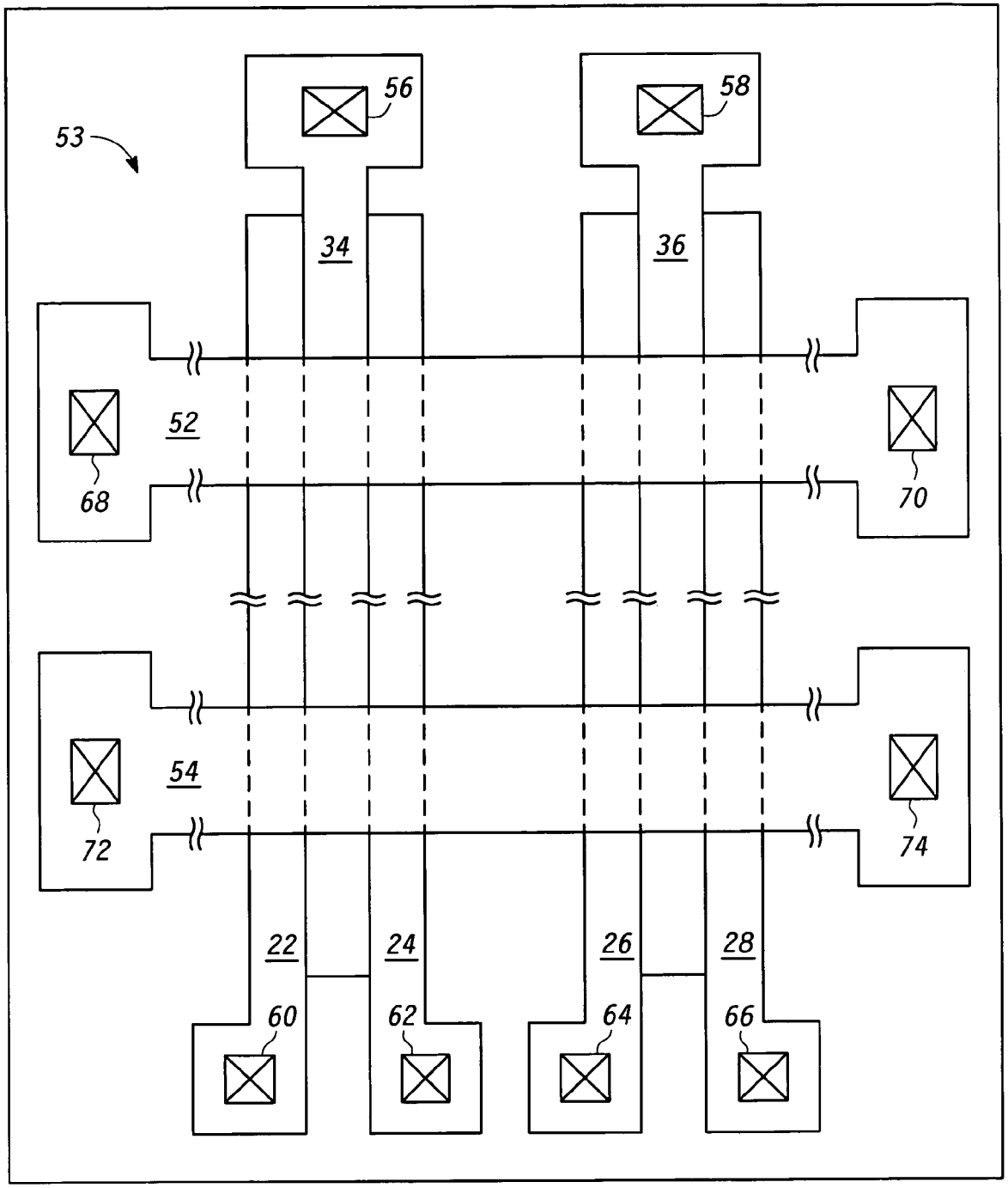
FIG. 7 is a top view of the storage device structure of FIGS. 1-6.

Shown in FIG. 7 is storage device structure 10 of FIG. 6 from a top view depicting a VGA type memory array 53 using the storage device structure of FIG. 6. Select gate 52 runs in what is commonly described as the row direction. An additional select gate 54 runs parallel to select gate 52. Similarly control gates 22, 24, 26, and 28 run in the column direction as do doped regions 34 and 36. These structures are connected as needed to peripheral structures through contacts to higher levels of interconnect (not shown). Contact 56 is for electrically connecting doped region 34 to an interconnect layer. Contact 58 is for electrically connecting doped region 36 to an interconnect layer. Contacts 60, 62, 64, and 66 are for connecting control gates 22, 24, 26, and 28, respectively, to an interconnect layer. Contacts 68 and 70 are for connecting select gate 52 to an interconnect layer. Contacts 72 and 74 are for connecting select gate 54 to an interconnect layer. An actual memory would of course have many more structures than those shown in FIG. 7. Doped regions 34 and 36 are used either as a source or a drain depending on the biasing of these regions.

In operation, a memory cell is defined as the structure between one doped region and an adjacent doped region. Thus for example, one memory cell comprises doped region 34, doped region 36, control gate 24, control gate 26, storage layer 42, storage layer 44, the portion of select gate 52 over control gate 24 and 26, and the portion of select gate 52 over dielectric layer 50 between control gates 24 and 26. The channel is the portion of semiconductor substrate 12 between doped regions 34 and 36 along the top surface of semiconductor substrate 12. Dielectric layer 50 functions as the gap dielectric where the electrons in the channel region gain energy for injection during programming. Storage layers 42 and 44 each provide the storage for a different bit of the cell. To program storage layer 44 of the memory cell, select gate 52 is biased to a voltage of about 2 to 3 volts, doped region 34, which functions as a source, is grounded, control gate 24 is biased to a voltage of about 2-3 volts, control gate 26 is biased to a voltage of about 5 to 6 volts, and doped region 36, which functions as a drain, is biased to about 5 volts. This establishes a current flow through the channel. Electrons come from the source, doped region 34, and are injected into storage layer 44 at the edge of control gate 26 that is closest to the source. Thus, source side injection is achieved. This is continued until storage layer 44 has captured sufficient electrons for providing enough bias to significantly impede current in the channel during a read operation.

During a read of the bit represented by storage layer 44, doped region 36 is operated as the drain and doped region 34 as the source, and both select gate 52 and control gates 24 and 26 are biased sufficiently to cause measurable current flow through the channel in the absence of being programmed. In the programmed condition, the accumulation of electrons in storage layer 44 prevents the channel from inverting in that the region of the channel immediately under where the electrons accumulated. This impedes current between doped regions 34 and 36 so that the difference in current flow between being programmed and not programmed is significant and can be measured. Erase is performed by biasing the control gates formed by sidewall spacers 20, 22, 24, 26, 28 and 30 to about minus 6 volts and semiconductor substrate 12 to about plus 6 volts.

Storage layer 42 also represents a bit and is programmed using doped region 36 as the source and doped region 34 as the drain. The program conditions are thus symmetrical to the conditions for programming storage layer 44. Thus, the conditions for programming storage layer 42 are: select gate 52 is biased to a voltage of about 2 to 3 volts, doped region 36, which functions as a source, is grounded, control gate 26 is biased to a voltage of about 2-3 volts, control gate 24 is biased to a voltage of about 5 to 6 volts, and doped region 34, which functions as the drain, is biased to about 5 volts. Read and erase of storage layer 42 are similarly symmetrical to that for storage layer 44 by exchanging the biases between doped regions 34 and 36 and exchanging the biases of control gates 24 and 26.

Similar operation is applied to the other memory cells shown in FIG. 7. The storage layer adjacent to storage layer 42 is storage layer 40 and shares doped region 34. Similarly storage layer 44 shares doped region 36 with storage layer 46. Thus the benefit of saving chip area by sharing both the doped regions and the select gates between cells is combined with the benefits of SSI.

In one form there is herein provided a method for forming a storage device structure. A substrate of a first conductivity type is provided. Overlying regions of sacrificial material are formed. A charge storage layer is formed overlying the regions of sacrificial material. Portions of the charge storage layer overlying the regions of sacrificial material are removed, the charge storage layer remaining along sidewalls of the regions of sacrificial material and between the regions of sacrificial material. Conductive sidewall spacers are formed adjacent to portions of the charge storage layer that are along sidewalls of the regions of sacrificial material, each of the conductive sidewall spacers respectively forming a control gate electrode of the storage device. The storage device structure is ion implanted to form source and drain diffusion regions in the substrate underlying and between the conductive sidewall spacers. The regions of sacrificial material are removed and portions of the charge storage layer along sidewalls of the conductive sidewall spacers are removed to leave the conductive sidewall spacers freestanding. Exposed surfaces of the conductive sidewall spacers, the charge storage layer and the substrate are electrically isolated. A conductive layer is formed overlying and between the conductive sidewall spacers, the conductive layer forming a continuous select gate electrode of the storage device.

In one form the charge storage layer is formed by forming a layer of discrete charge storage elements. In another form the layer of discrete charge storage elements is formed by forming one of a layer of nanoclusters or a layer of nitride. In yet another form the charge storage layer is formed by forming a layer of non-discrete charge storage elements. In yet another form one of polycrystalline silicon, microcrystalline silicon or a metal is used as the material for the non-discrete charge storage elements. In another form the storage device structure is ion implanted to form source and drain diffusion regions by self-aligning locations of the source and drain diffusions with the conductive sidewall spacers. In another form nitride is used as the sacrificial material.

In another form there is provided a method for forming a storage device structure by providing a substrate and forming a plurality of sacrificial material structures overlying the substrate. A charge storage layer is formed on all exposed surfaces of the sacrificial material structures and the substrate. For each of the sacrificial material structures, two discrete conductive sidewall spacers are formed on opposing sides thereof, the two discrete conductive sidewall spacers forming two discrete control gate electrodes per memory cell of the storage device structure. Current electrode diffusions in the substrate are formed by using the discrete conductive sidewall spacers and the sacrificial material structures as alignment features. The plurality of sacrificial material structures is removed to expose portions of the substrate. An insulating layer is provided overlying exposed portions of the substrate and the discrete conductive sidewall spacers. A continuous conductive layer is formed as a select gate control electrode common to a plurality of memory cells and overlying the current electrode diffusions and between each of the discrete control gate electrodes.

In another form the plurality of sacrificial material structures is formed as a plurality of substantially rectangular regions. In yet another form the storage device structure is biased to permit each of the plurality of diffusions to function as a source for a first of two storage bits in a single memory cell and as a drain for a second of the two storage bits. In yet another form the charge storage layer is formed by forming a layer of discrete charge storage elements. In another form the layer of discrete charge storage elements is formed by forming one of a layer of nanoclusters or a layer of nitride. In yet another form the charge storage layer is formed by a layer of non-discrete charge storage elements. In another form one of polycrystalline silicon, microcrystalline silicon or a metal is used as the material for the non-discrete charge storage elements.

In yet another form there is provided a storage device structure having a substrate and a plurality of diffusions formed in the substrate. Each of the plurality of diffusions functions separately in time as a source or a drain during programming and reading of the storage device structure. A plurality of freestanding sidewall spacers is provided, each of the plurality of freestanding sidewall spacers overlying the substrate and a charge storage layer, the plurality of freestanding sidewall spacers not overlying central portions of the plurality of diffusions, and the plurality of freestanding sidewall spacers functioning as control gate electrodes. A continuous conductive layer overlies the current electrode diffusions and is formed between each of the discrete control gate electrodes. The continuous conductive layer functions as a select gate control electrode common to a plurality of memory cells in the storage device structure. In one form the charge storage layer extends between the substrate and multiple ones of the plurality of freestanding sidewall spacers. In another form a dielectric layer overlies and electrically isolates each of the plurality of freestanding sidewall spacers from the continuous conductive layer and electrically isolates the plurality of diffusions and the substrate from the continuous conductive layer. In yet another form each of the plurality of memory cells that is formed in the storage device structure has two bits. In yet another form the charge storage layer is a layer of discrete charge storage elements. In yet another form the plurality of diffusions extend laterally beyond from below the continuous conductive layer to permit electrical contact Various changes and modifications to the embodiments herein chosen for purposes of illustration will readily occur to those skilled in the art. For example, these embodiments have been shown using a bulk silicon substrate but another substrate type, such as semiconductor on insulator (SOI) or SOI hybrid, could also be used. Specific voltages and voltage ranges were given for programming but other voltages may also be effective. Also, hot carrier injection (HCI) can also be used in conjunction with SSI to cause programming at interior portions of the storage layers. Thus for example programming could be at both the left and right side of storage layer 42. By injecting electrons near doped region 34 using HCI and injecting electrons at the lateral outside edge of storage layer 42 near select gate 52 using SSI, two bits of information may be programmed in storage layer 42. To the extent that such modifications and variations do not depart from the spirit of the invention, they are intended to be included within the scope thereof which is assessed only by a fair interpretation of the following claims.

What is claimed is:

1. A method for forming a storage device structure comprising:

providing a substrate of a first conductivity type;

forming overlying regions of sacrificial material;

forming a charge storage layer overlying the regions of sacrificial material and removing portions of the charge storage layer overlying the regions of sacrificial material, the charge storage layer remaining along sidewalls of the regions of sacrificial material and between the regions of sacrificial material;

forming conductive sidewall spacers adjacent to portions of the charge storage layer that are along sidewalls of the regions of sacrificial material, each of the conductive sidewall spacers respectively forming a control gate electrode of the storage device structure;

ion implanting the storage device structure to form source and drain diffusion regions in the substrate underlying and between the conductive sidewall spacers;

removing the regions of sacrificial material and removing portions of the charge storage layer along sidewalls of the conductive sidewall spacers to leave the conductive sidewall spacers freestanding;

electrically isolating exposed surfaces of the conductive sidewall spacers, the charge storage layer and the substrate; and forming a conductive layer overlying and between the conductive sidewall spacers, the conductive layer forming a continuous select gate electrode of the storage device structure.

2. The method of claim 1 further comprising:

forming the charge storage layer by forming a layer of discrete charge storage elements.

3. The method of claim 2 wherein forming the layer of discrete charge storage elements further comprise:

forming one of a layer of nanoclusters or a layer of nitride.

4. The method of claim 1 further comprising:

forming the charge storage layer by forming a layer of non-discrete charge storage elements.

5. The method of claim 4 further comprising:
using one of polycrystalline silicon, microcrystalline silicon or a metal as material for the non-discrete charge storage elements.

6. The method of claim 1 further comprising:
ion implanting the storage device structure to form source and drain diffusion regions by self-aligning locations of the source and drain diffusion regions with the conductive sidewall spacers.

7. The method of claim 1 further comprising:
using nitride as the sacrificial material.

8. A method for forming a storage device structure comprising:
providing a substrate;
forming a plurality of sacrificial material structures overlying the substrate;
forming a charge storage layer on all exposed surfaces of the plurality of sacrificial material structures and the substrate;
for each of the plurality of sacrificial material structures, forming two discrete conductive sidewall spacers on opposing sides thereof, the two discrete conductive sidewall spacers forming two discrete control gate electrodes per memory cell of the storage device structure;
forming current electrode diffusions in the substrate by using the discrete conductive sidewall spacers and the plurality of sacrificial material structures as alignment features;
removing the plurality of sacrificial material structures to expose portions of the substrate;
providing an insulating layer overlying exposed portions of the substrate and the discrete conductive sidewall spacers; and
forming a continuous conductive layer as a select gate control electrode common to a plurality of memory cells and overlying the current electrode diffusions and between each of the discrete control gate electrodes.

9. The method of claim 8 further comprising:
forming the plurality of sacrificial material structures as a plurality of substantially rectangular regions.

10. The method of claim 8 further comprising:
biasing the storage device structure to permit each of the current electrode diffusions to function as a source for a first of two storage bits in a single memory cell and as a drain for a second of the two storage bits.

11. The method of claim 8 further comprising:
forming the charge storage layer by forming a layer of discrete charge storage elements.

12. The method of claim 11 wherein forming the layer of discrete charge storage elements further comprise:
forming one of a layer of nanoclusters or a layer of nitride.

13. The method of claim 8 further comprising:
forming the charge storage layer by forming a layer of non-discrete charge storage elements.

14. The method of claim 13 further comprising:
using one of polycrystalline silicon, microcrystalline silicon or a metal as material for the non-discrete charge storage elements.

* * * * *